(12) United States Patent
Rachbauer et al.

(10) Patent No.: US 9,885,106 B2
(45) Date of Patent: Feb. 6, 2018

(54) (AL, CR, TA)N COATING FOR ENHANCED HIGH TEMPERATURE RESISTANCE

(71) Applicant: Oerlikon Surface Solutions AG, Pfaffikon, Pfaffikon SZ (CH)

(72) Inventors: Richard Rachbauer, Feldkirch (AT); Robert Hollerweger, Henndorf (AT); Paul Heinz Mayrhofer, Neckenmarkt (AT)

(73) Assignee: OERLIKON SURFACE SOLUTIONS AG, PFÄFFIKON, Pfäffikon Sz (CH)

( * ) Notice: Subject to any disclaimer, the term of this patent is extended or adjusted under 35 U.S.C. 154(b) by 85 days.

(21) Appl. No.: 15/034,904

(22) PCT Filed: Nov. 10, 2014

(86) PCT No.: PCT/EP2014/002996
§ 371 (c)(1),
(2) Date: May 6, 2016

(87) PCT Pub. No.: WO2015/070967
PCT Pub. Date: May 21, 2015

(65) Prior Publication Data
US 2016/0348228 A1 Dec. 1, 2016

(30) Foreign Application Priority Data
Nov. 12, 2013 (DE) .................. 10 2013 018 867

(51) Int. Cl.
*C23C 14/06* (2006.01)
*C23C 30/00* (2006.01)
(Continued)

(52) U.S. Cl.
CPC ............ *C23C 14/0641* (2013.01); *C09D 1/00* (2013.01); *C09D 5/00* (2013.01); *C23C 14/22* (2013.01); *C23C 30/005* (2013.01)

(58) Field of Classification Search
USPC ....... 204/192.15, 192.16; 428/212, 217, 697, 428/698, 699
See application file for complete search history.

(56) References Cited

U.S. PATENT DOCUMENTS

| 8,211,554 | B2* | 7/2012 | Fontaine | C08J 7/047 428/697 |
| 2003/0148145 | A1* | 8/2003 | Yamamoto | C23C 14/0641 428/698 |
| 2008/0318062 | A1* | 12/2008 | Endrino | C23C 14/0635 428/446 |

FOREIGN PATENT DOCUMENTS

JP 2006-334740 A 12/2006
JP 2007-105843 A 4/2007
(Continued)

OTHER PUBLICATIONS

International Search Report for PCT/EP2014/002996 dated Feb. 12, 2015.
Written Opinion for PCT/EP2014/002996 dated Feb. 12, 2015.

*Primary Examiner* — Archene Turner
(74) *Attorney, Agent, or Firm* — Pearne & Gordon LLP (57) ABSTRACT

A hard coating containing at least one layer including chromium, aluminum, tantalum and nitrogen as main components and a chemical composition (AlaCrbTac)N in which the following conditions are satisfied: a=x, (1−c), b=(1−x)·(1−c), 0.60≤x≤0.70, and 0.01≤c≤0.5. The layer has an X-ray diffraction peak intensity ratio of I200/(I200+I111)≥0.25. The application also relates to a reactive arc ion plating PVD process for making the hard coating.

11 Claims, 9 Drawing Sheets

(51) Int. Cl.
  *C09D 1/00*   (2006.01)
  *C09D 5/00*   (2006.01)
  *C23C 14/22*  (2006.01)

(56) References Cited

FOREIGN PATENT DOCUMENTS

JP    2011-224714 A      11/2011
WO    2010/150411    *   12/2010

* cited by examiner

(AL, CR, TA)N COATING FOR ENHANCED HIGH TEMPERATURE RESISTANCE

The present invention relates to a simple coating system comprising aluminum (Al), chromium (Cr), tantalum (Ta) and nitrogen (N) as main components which provides wear protection to tools and/or components exposed to tribological contact at elevated temperatures. This coating exhibits in particular an excellent chemical and mechanical stability at elevated temperatures. Particularly, the present invention relates to a hard coating comprising at least one layer comprising Al, Cr, Ta and N as main components and having chemical composition regarding this elements according to the formula $(Al_aCr_bTa_c)N$, where a, b and c are respectively the concentration of aluminum, chromium and tantalum in atomic ratio considering only Al, Cr and Ta for the calculation of the element composition in the layer, whereby $a=x\cdot(1-c)$, $b=(1-x)\cdot(1-c)$, $0.60\leq x\leq 0.70$, $0.01\leq c\leq 0.5$, and the $(Al_aCr_bTa_c)N$ layer at least exhibits a X-ray diffraction peak intensity ratio $I_{200}/(I_{200}+I_{111})\geq 0.25$.

STATE OF THE ART

Protecting cutting tools by coating tool surfaces with (Cr,Al,Ta)N hard coatings deposited from CrAlTa-containing targets in a reactive nitrogen atmosphere by using arc ion plating techniques is an already known practice.

JP2006334740A teaches for example that (Cr,Al,Ta)N hard coatings can be useful for attaining excellent wear resistance of cutting tools used in high speed cutting operations of highly reactive materials but only if the (Cr,Al,Ta)N coatings have a determined coating structure and a determined coating composition. JP2006334740A proposes that the (Cr,Al,Ta)N hard coating comprises a lower layer having an average layer thickness of about 2 to 6 μm and an upper layer having an average layer thickness of about 0.5 to 1.5 μm. The lower layer having a single layer structure and chemical composition $Cr_{1-(E+F)}Al_ETa_F$ with $E=0.45-0.65$ and $F=0.01-0.09$ in atomic ratio considering only Cr, Al and Ta for the calculation of the element composition in the lower layer. The upper layer having a multilayer structure comprising two types of layers, A and B, deposited alternated one of each other, the layers A and B being nanolayer, each one having a single nanolayer thickness of about 5-20 nm. Each nanolayer A having chemical composition $Cr_{1-(A+B)}Al_ATa_B$ with $A=0.01-0.10$ and $B=0.50-0.70$ in atomic ratio considering only Cr, Al and Ta for the calculation of the element composition in the corresponding nanolayer A. Each nanolayer B having chemical composition $Cr_{1-(C+D)}Al_CTa_D$ with $C=0.30-0.45$ and $B=0.20-0.35$ in atomic ratio considering only Cr, Al and Ta for the calculation of the element composition in the corresponding nanolayer B.

Similarly, JP2007105843A reports about the use of (Cr, Al,Ta)N hard coatings comprising a lower layer and an upper layer having determined layer structure, thickness and element composition for providing excellent wear resistance to tools used in high speed cutting of highly reactive materials. JP2007105843A teaches like JP2006334740A that the average layer thickness of the lower layer and the upper layer should be about 2 to 6 μm and about 0.5 to 1.5 μm, respectively. For attaining the desired wear resistance:
the lower layer should have a single layer structure with chemical composition $Cr_{1-(x+y)}Al_xTa_y$, with $x=0.50-0.65$ and $y=0.01-0.10$ in atomic ratio considering only Cr, Al and Ta for the calculation of the element composition in the lower layer, and
the upper layer should have a multilayer structure comprising two types of layers, A and B, deposited alternated one of each other, and
the layers A and B should be nanolayers, each one having single layer thickness of about 5-20 nm, and
each nanolayer A should have chemical composition $Cr_{1-(E+F)}Al_ETa_F$ with $E=0.15-0.30$ and $F=0.20-0.35$ in atomic ratio considering only Cr, Al and Ta for the calculation of the element composition in the corresponding nanolayer A, and
each nanolayer B should have chemical composition $Cr_{1-(M+N)}Al_MTa_N$ with $M=0.50-0.65$ and $N=0.01-0.10$ in atomic ratio considering only Cr, Al and Ta for the calculation of the element composition in the corresponding nanolayer B.

However, the complex constitution of the aforementioned (Cr,Al,Ta)N hard coatings which requires the deposition of different layers and nanolayers having defined layer thicknesses as well as different element compositions along the complete coating constitution results in very high requirements regarding complexity of the coating process. A high risk of confusion of the targets having different compositions is also one disadvantage by depositing the aforementioned (Cr,Al,Ta)N hard coatings. One more disadvantage by the deposition of the aforementioned (Cr,Al,Ta)N hard coatings is the difficult of depositing nanolayers one by one which should have completely different element compositions regardless of the very small required nanolayer thicknesses (about 5-20 nm), in particular if different kind of tools (e.g. tools having different dimensions and/or geometries) must be coated.

OBJECTIVE OF THE PRESENT INVENTION

Main objective of the present invention is to provide a (Cr,Al,Ta)N hard coating having a simple coating constitution, particularly in comparison with the aforementioned (Cr,Al,Ta)N hard coating according to the state of the art but providing also excellent wear resistance to tools used in high speed cutting of highly reactive materials.

DESCRIPTION OF THE INVENTION

The aforementioned objective is achieved by the present invention by providing a hard coating according to claim 1.

A hard coating according to the present invention comprises at least one layer comprising chromium, aluminum tantalum and nitrogen at least as main components and having chemical composition regarding this elements according to the formula: $(Al_aCr_bTa_c)N$, where a, b and c are respectively the concentration of aluminum, chromium and tantalum in atomic ratio considering only Al, Cr and Ta for the calculation of the element composition in the layer, whereby:

$a=x\cdot(1-c)$, $b=(1-x)\cdot(1-c)$, and $0.60\leq x\leq 0.70$, and $0.01\leq c\leq 0.5$, and where at least one $(Al_aCr_bTa_c)N$ layer exhibits a X-ray diffraction peak intensity ratio $I_{200}/(I_{200}+I_{111})\geq 0.25$.

The present invention will be explained following in more detail by means of some examples:

Coating Process and Methods used for the Coating Examination

Different hard coatings according to the present invention were deposited in an INNOVA Balzers arc evaporation plant in a reactive nitrogen atmosphere.

Four different kinds of targets comprising aluminum, chromium and tantalum and differing in nominal chemical composition in atomic ratio were used for conducting the experiments. Following chemical compositions were used for depositing corresponding $(Al_aCr_bTa_c)N$ layers:

$Al_{0.686}Cr_{0.294}Ta_{0.020}$,
$Al_{0.665}Cr_{0.285}Ta_{0.050}$,
$Al_{0.630}Cr_{0.270}Ta_{0.100}$ and
$Al_{0.560}Cr_{0.240}Ta_{0.200}$ Also tantalum free targets comprising aluminum and chromium and having nominal chemical composition in atomic ratio of $Al_{0.70}Cr_{0.30}$ were used for depositing (Al,Cr)N layers.

The $(Al_aCr_bTa_c)N$ and (Al,Cr)N coating layers were deposited by using reactive arc ion plating deposition techniques, the aforementioned targets were arced in nitrogen reactive atmosphere during 60 min for the formation of the corresponding coating layers. The coatings were deposited on 4 different kind of substrates: 1) Si (100), 2) iron foil (1.0330), 3) S600 high speed steel, and 4) austenite, by using an arc current of 150 A, a nitrogen pressure of 3.5 Pa and a negative BIAS of −40, −80, and −120 V.

A Zeiss EVO50 scanning electron microscope (SEM) was used for examining surface and cross sectional images. The chemical composition was determined with the attached Oxford Instruments INCA energy dispersive X-ray spectroscopy (EDX) system. For investigating structure of the cross sections in the nm range a FEI TECNAI G20 transmission electron microscope (TEM) was used. Structural investigations were carried out on a PANalytical X'pert diffractometer in Bragg Brentano geometry and with CuKa radiation. A CSIRO UMIS nano indentation system by Fischer Cripps Laboratories was used for obtaining load displacement curves with a maximal load between 12 and 30 mN. These curves were evaluated after Oliver and Pharr to determine the hardness and Young's modulus values.

Coating Characterization

Table 1 shows a comparison between the chemical compositions of the different target materials and the corresponding (Al,Cr,Ta)N coatings deposited at a BIAS voltage of −40, −80, and −120 V.

The ratio Al/(Al+Cr) in atomic percentage corresponding to the (Al,Cr)N coatings deposited from the tantalum free targets having chemical composition $Al_{0.70}Cr_{0.30}$ was about 66 at % (lower than 70 at %).

By using Ta-containing targets it was observed that by increasing Ta content in the targets of up to 20 at % a diminution of Al in the deposited layers is detected and consequently the Al/(Al+Cr) ratio decreases to about 63 at % even though the ratio Al/(Al+Cr) in the targets was maintained constant at about 70 at %.

Contrariwise, Ta content in the deposited layers is about 50% higher than the corresponding Ta content in the targets used for their deposition.

Figure 1:
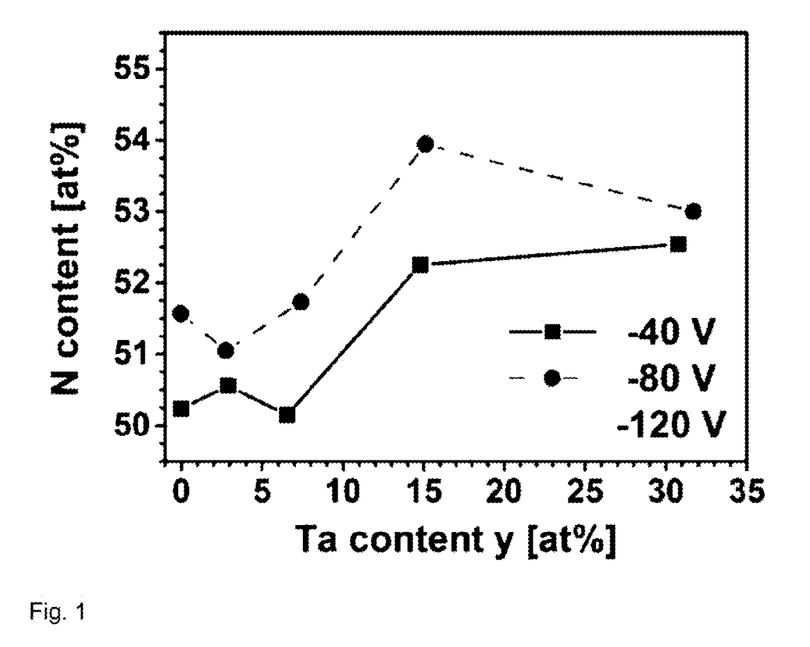
FIG. 1: Nitrogen content of (Al,Cr,Ta)N coatings with increasing Ta content and for BIAS voltages of −40, −80, and −120 V.
Figure 2A:
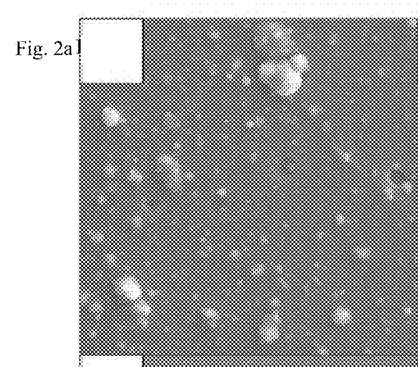
FIG. 2a-2b: Surface images of $Cr_{0.34}Al_{0.66}N$ coatings deposited on S600 high speed steel at BIAS voltages of −40 and −120 V.
Figure 2B:
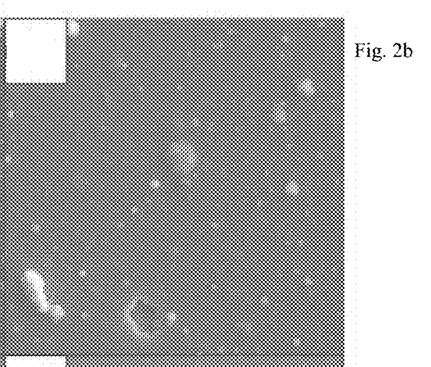
Figure 2C:
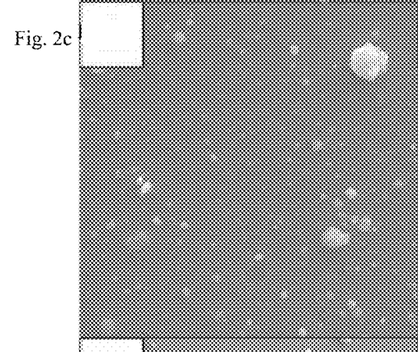
FIG. 2c-2d: Surface images of $Cr_{0.33}Al_{0.60}Ta_{0.07}N$ coatings deposited on S600 high speed steel at BIAS voltages of −40 and −120 V.
Figure 2D:
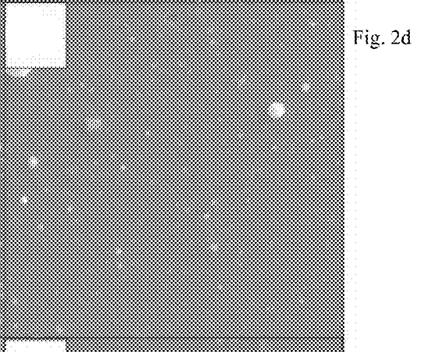
Figure 2E:
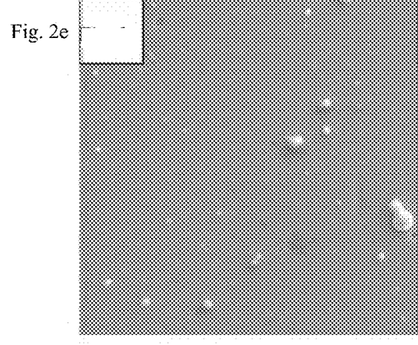
FIG. 2e-2f: Surface images of $Cr_{0.25}Al_{0.44}Ta_{0.31}N$ coatings deposited on S600 high speed steel at BIAS voltages of −40 and −120 V.
Figure 2F:
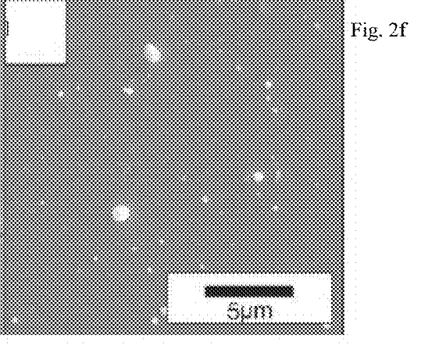

The nitrogen content of the (Al,Cr,Ta)N coatings tends to be slightly over-stoichiometric and increases by increasing BIAS voltage and Ta content as it is shown in FIG. 1. However, for simplifying the labeling of the different coatings for presenting the results of the examinations, the nitrogen content was normalized for all coatings to 50 at %.

TABLE 1

Chemical composition of the different sets of Al—Cr—Ta targets and the corresponding metal sublattice compositions of the deposited (Al,Cr,Ta)N coatings at a BIAS voltage of −40, −80, and −120 V.

| target: composition | | | | coating: metal sublattice composition | | | | | |
|---|---|---|---|---|---|---|---|---|---|
| Cr [at %] | Al [at %] | Ta [at %] | Al/(Cr + Al) [at %] | BIAS [V] | Cr [at %] | Al [at %] | Ta [at %] | Al/(Cr + Al) [at %] | label |
| 30 | 70 | — | 70 | −40 | 33.5 | 66.5 | — | 66.5 | $Cr_{0.34}Al_{0.66}N$ |
|  |  |  |  | −80 | 34.2 | 65.8 | — | 65.8 |  |
|  |  |  |  | −120 | 34.7 | 65.3 | — | 65.3 |  |
| 29.4 | 68.6 | 2 | 70 | −40 | 33.2 | 64.0 | 2.8 | 65.8 | $Cr_{0.33}Al_{0.64}Ta_{0.03}N$ |
|  |  |  |  | −80 | 33.7 | 63.5 | 2.8 | 65.3 |  |
|  |  |  |  | −120 | 33.8 | 63.2 | 2.9 | 65.2 |  |
| 28.5 | 66.5 | 5 | 70 | −40 | 33.3 | 60.2 | 6.5 | 64.4 | $Cr_{0.33}Al_{0.60}Ta_{0.07}N$ |
|  |  |  |  | −80 | 32.2 | 60.4 | 7.4 | 65.3 |  |
|  |  |  |  | −120 | 32.7 | 59.7 | 7.6 | 64.6 |  |
| 27 | 63 | 10 | 70 | −40 | 30.7 | 53.9 | 15.4 | 63.8 | $Cr_{0.30}Al_{0.55}Ta_{0.15}N$ |
|  |  |  |  | −80 | 29.5 | 55.4 | 15.1 | 65.2 |  |
|  |  |  |  | −120 | 29.9 | 55.3 | 14.8 | 65.0 |  |
| 24 | 56 | 20 | 70 | −40 | 25.2 | 43.8 | 31.0 | 63.5 | $Cr_{0.25}Al_{0.44}Ta_{0.31}N$ |
|  |  |  |  | −80 | 25.6 | 42.7 | 31.7 | 62.6 |  |
|  |  |  |  | −120 | 25.3 | 43.9 | 30.8 | 63.5 |  |

Figure 3A:
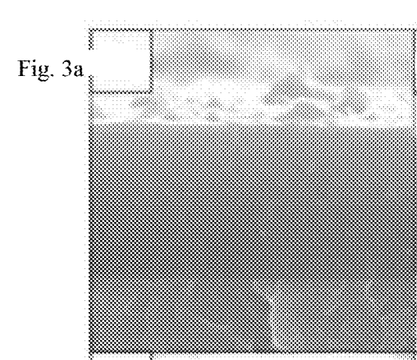
FIG. 3a-3b: Cross sectional micrographs of $Cr_{0.34}Al_{0.66}N$ coatings deposited on S600 high speed steel at BIAS voltages of −40 and −120 V.
Figure 3B:
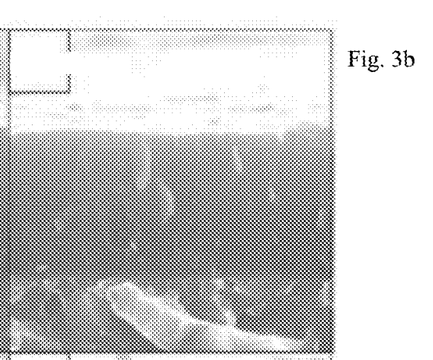
Figure 3C:
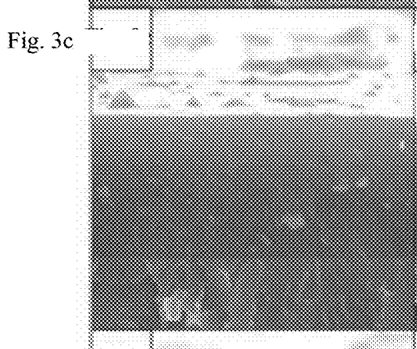
FIG. 3c-3d: Cross sectional micrographs of $Cr_{0.33}Al_{0.60}Ta_{0.07}N$ coatings deposited on S600 high speed steel at BIAS voltages of −40 and −120 V.
Figure 3D:
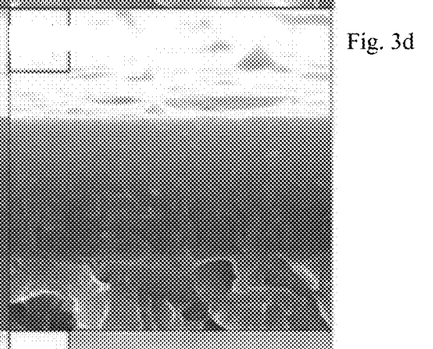
Figure 3E:
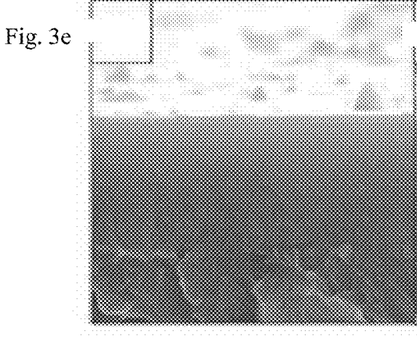
FIG. 3e-3f: Cross sectional micrographs of $Cr_{0.25}Al_{0.44}Ta_{0.31}N$ coatings deposited on S600 high speed steel at BIAS voltages of −40 and −120 V.
Figure 3F:
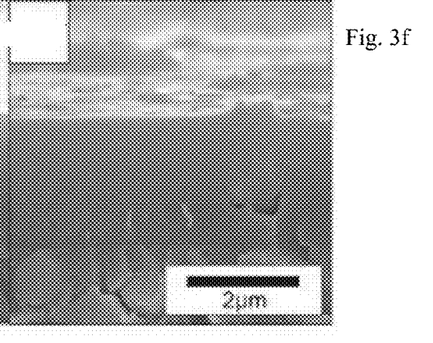
Figure 4A:
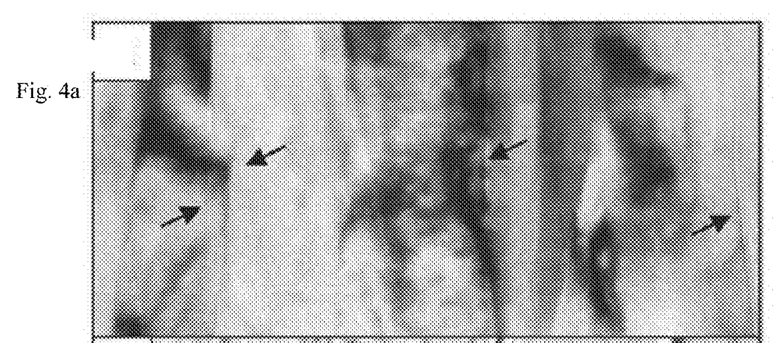
FIG. 4a: TEM bright-field image of $Cr_{0.34}Al_{0.66}N$ deposited at −40 V of BIAS. Arrows indicate under-dense column boundaries.
Figure 4B:
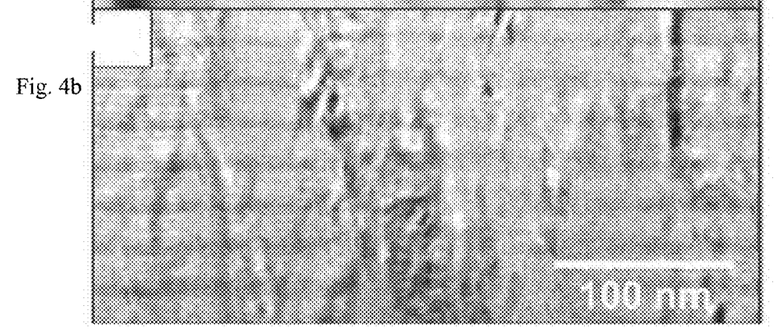
FIG. 4b: TEM bright-field image of $Cr_{0.25}Al_{0.44}Ta_{0.31}N$ deposited at −40 V of BIAS. Arrows indicate under-dense column boundaries.

SEM Surface images of selected samples of (Al,Cr,Ta)N coatings are shown in FIG. 2. $Cr_{0.34}Al_{0.66}N$ deposited at −40 V of BIAS (FIG. 2a) exhibits a rough surface with droplets the size of ~1 um in diameter and also a huge amount of smaller droplets. With increasing the Ta content to 7 at % on the metal sublattice ($Cr_{0.33}Al_{0.60}Ta_{0.07}N$, FIG. 2c) the size and amount of droplets decreases significantly and for even higher contents of 31 at % of Ta ($Cr_{0.25}Al_{0.44}Ta_{0.31}N$, FIG. 6.2e) the film surface appears very homogenous and flat with just few droplets on top (max. diameter ~0.5 μm). Increasing the BIAS voltage to −120 V leads to a clear improvement of the surface morphology of $Cr_{0.34}Al_{0.66}N$ (see FIG. 2b). Nevertheless, the effect of an increased BIAS voltage seems to be less pronounced for Ta alloyed $Cr_{0.33}Al_{0.60}Ta_{0.07}N$ (FIG. 2d) and not detectable for $Cr_{0.25}Al_{0.44}Ta_{0.31}N$ (FIG. 2f). Decreasing droplet densities with increasing Ta content could be based on the formation of intermetallic phases on the target surface which lead to an increased melting point of the target material and hence decreased droplet formation. However, the heavy Ta atom (compare: Ta ~181 g/mol, Ti ~48 g/mol, and Al ~27 g/mol) might have a significant "etching" (or resputtering) effect on the substrate surface and hence even at −40 V of BIAS small droplets could be atomized and large droplets significantly etched. The resputtering effect is besides densification a possible reason for decreasing film thicknesses from ~2.7 to ~2.3 um with increasing the Ta content from 0 to 31 at % and decreasing thicknesses of up to ~0.2 um with increasing the BIAS voltage from −40 to −120 V. Corresponding fracture cross-sectional micrographs exhibit a columnar structure for Ta-free $Cr_{0.34}Al_{0.66}N$ (FIG. 3a and b). This columnar structure appears much less pronounced for $Cr_{0.33}Al_{0.60}Ta_{0.07}N$ (FIG. 3c and d) and at very high Ta contents like for $Cr_{0.25}Al_{0.44}Ta_{0.31}N$ the fracture surface is very smooth and columns can hardly be detected. A clear influence of the BIAS voltage cannot be observed for the fracture cross-sections—compare therefore the −40 and −120 V images of FIGS. 3a, c, e and FIGS. 3b, d, f, respectively. However, TEM investigations of $Cr_{0.34}Al_{0.66}N$ deposited at −40 V BIAS exhibit a columnar structure with a column size of around 50 nm, see FIG. 4a. At the column boundaries under-dense areas can be detected (indicated by the arrows). In contrary, for very high Ta contents like for $Cr_{0.25}Al_{0.44}Ta_{0.31}N$ (FIG. 4b) the columnar structure is not fully developed and open column- or grain-boundaries cannot be observed. Due to the two-fold rotation of our samples mounted to the carousel and the high mass difference of the used elements also a layered structure develops even if the coating is deposited from equal composite targets. In this case of bright-field images the dark layer regions are enriched by heavy elements and the bright ones by light elements. Increasing BIAS voltages and atomic masses leads in general to an increase of the etching power. The TEM images presented in FIG. 4 clearly indicate that the heavy Ta can improve the density of the coating (especially column boundaries) even at −40 V of BIAS and for all different investigated Ta contents.

Figure 5:
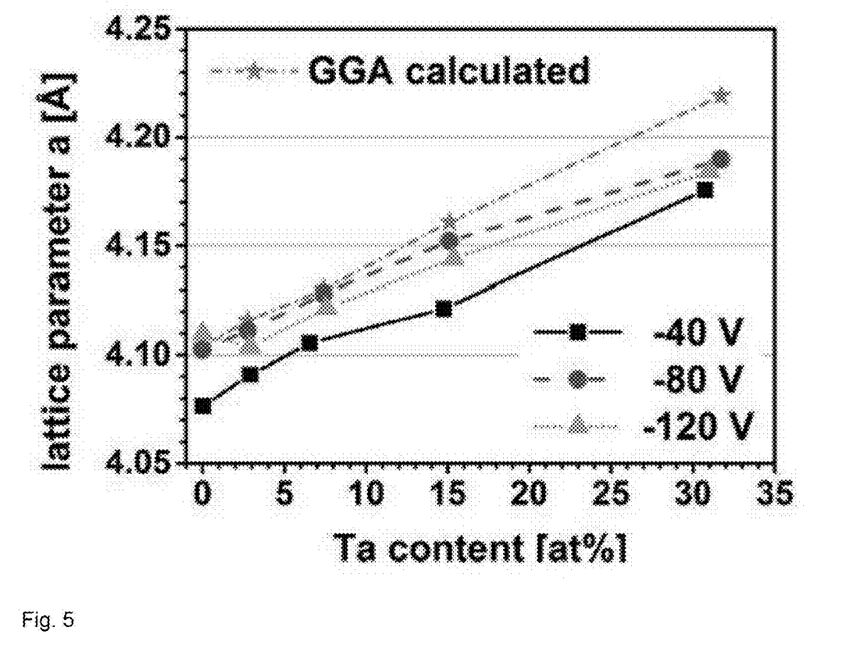
FIG. 5: Experimentally obtained lattice parameters for BIAS voltages of −40, −80, and −120 V in comparison with ab initio calculated lattice parameters of (Al,Cr,Ta)N coatings.

Ab initio calculated lattice parameters (star symbols in FIG. 5) indicate an increasing lattice parameter with increasing Ta-content, which is confirmed by the experimental data of the (Al,Cr,Ta)N coatings in FIG. 5.

Figure 6:
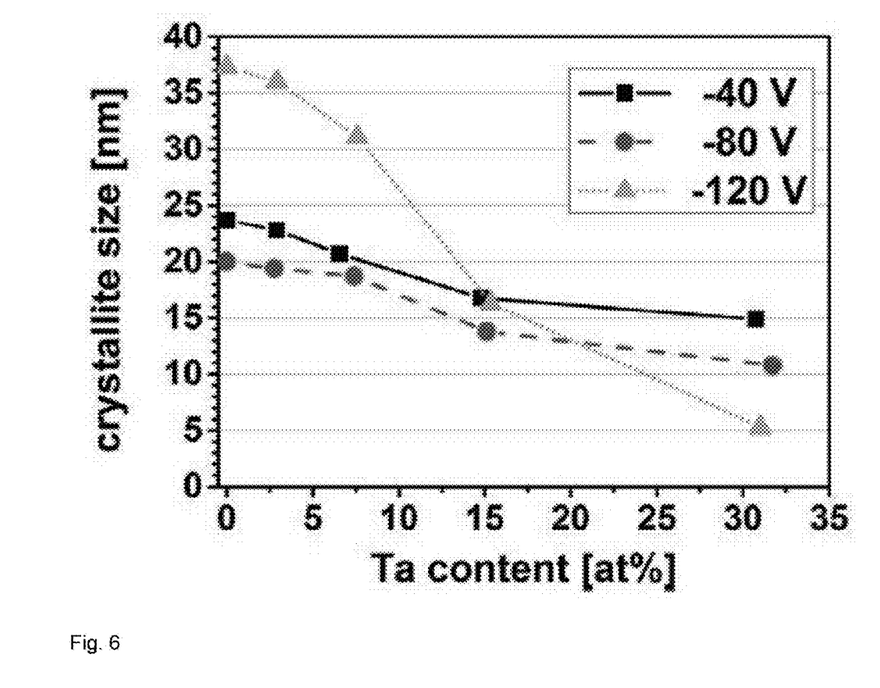
FIG. 6: Crystallite size of (Al,Cr,Ta)N coatings obtained by a quadratic Williamson Hall plot from powder diffraction patterns

The BIAS voltage and the Ta content are of course also influencing the grain size of the (Al,Cr,Ta)N coatings. In FIG. 6 it is shown that for −40 V of BIAS the crystallite size is linearly decreasing from ~24 to ~15 nm with increasing Ta content; for −80 V decreasing grain sizes between ~20 to ~10 nm can be observed. However, at a BIAS voltage of −120 V the coatings exhibit an unexpected large crystallite size of 37, 36, and 31 nm in Ta-free layers and for a Ta content of about 3 at % and 7 at %, respectively and a very small grain size of only ~5 nm for Ta content of about 31 at %.

Further, by increasing the amount of Ta in the layers up to 15 and 31 at % it is possible to form layers having crystallites with a crystallite size of about 17 and about 5 nm, respectively.

Figure 7:
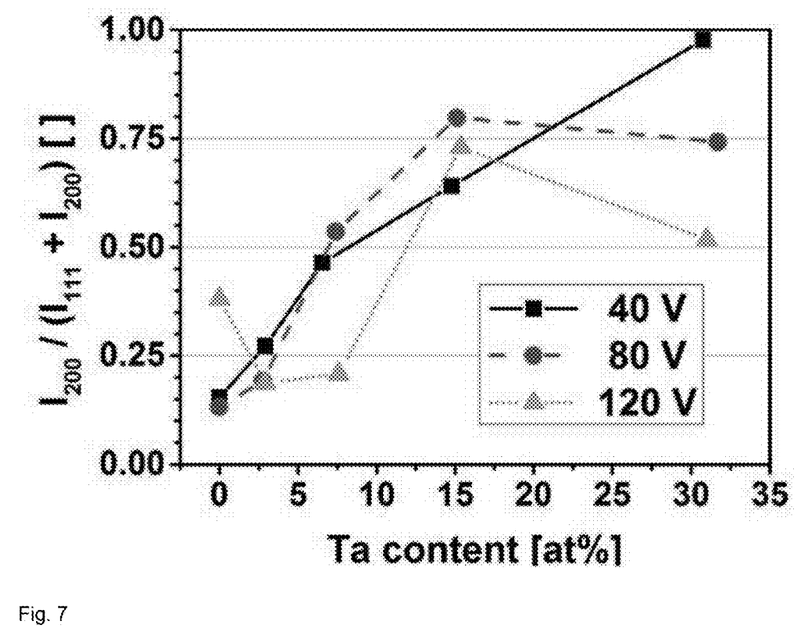
FIG. 7: Texture coefficient of (Al,Cr,Ta)N coatings on austenite in dependency of the Ta content and BIAS voltage.

The preferred orientation of the (Al,Cr,Ta)N coatings on austenite is exemplarily indicated by the peak intensity ratio $I_{200}/(I_{200}+I_{111})$ in FIG. 7. For Ta-free $Cr_{0.34}Al_{0.66}N$ a highly 111 preferred orientation can be observed for −40 V of BIAS, which is linearly changing into a 200 orientation with increasing Ta content. In this case, increasing BIAS voltages (e.g. up to −80 V) do not significantly influence this tendency. However, also other coating parameters, such as magnetic field arrangement, pressure or process temperature, can be adjusted in order to intensify the apparent effect.

The change of texture with increasing Ta-content in the coatings goes along with a decrease in grain size, as to be seen in FIG. 6.

SEM and TEM cross sections and the grain size analysis (FIGS. 3, 4 and 6) also suggest that with increasing Ta content film growth mechanisms are substantially influenced. For low Ta contents mainly columnar growth can be observed whereas the nano-crystalline growth could be attained by using higher Ta contents (~31 at %) on the metal sublattice as an alternative to high BIAS voltages of >−120 V for Ta-free (Al,Cr)N coatings.

Figure 8:
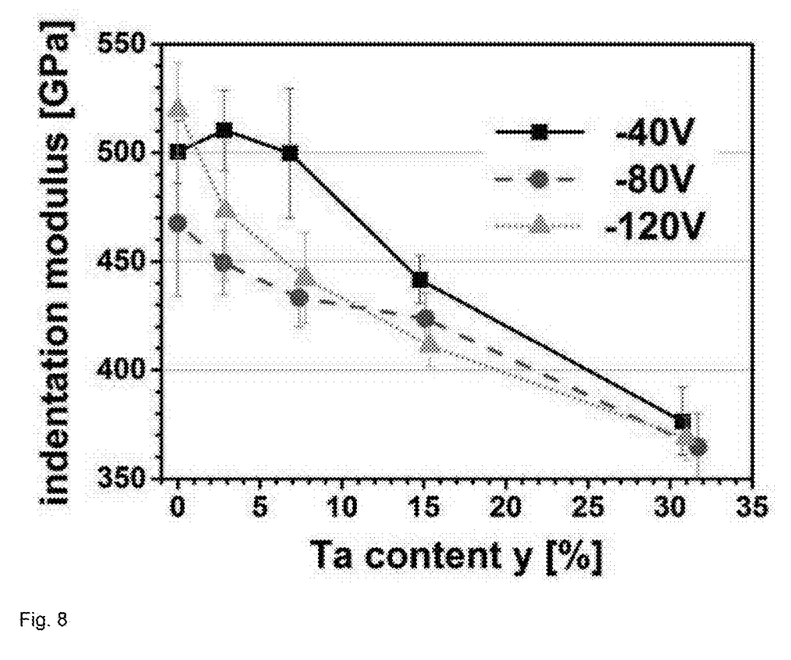
FIG. 8: Indentation modulus of (Al,Cr, Ta)N coatings on S600 high speed steel in dependency of the Ta content y and BIAS voltage.

An additional effect of adding Ta in (Al,Cr)N and/or increasing Ta content in (Al,Cr)N coating according to the present invention is the attainment of smaller Young's modulus. In FIG. 8 it can be observed that the indentation modulus for Ta-free $Cr_{0.34}Al_{0.66}N$ at a BIAS voltage of −40 V clearly deviates from the general trend. This can be explained as a consequence of the under-dense grain boundaries observed in the cross sectional TEM images corresponding to this coating in FIG. 4a.

Figure 9:
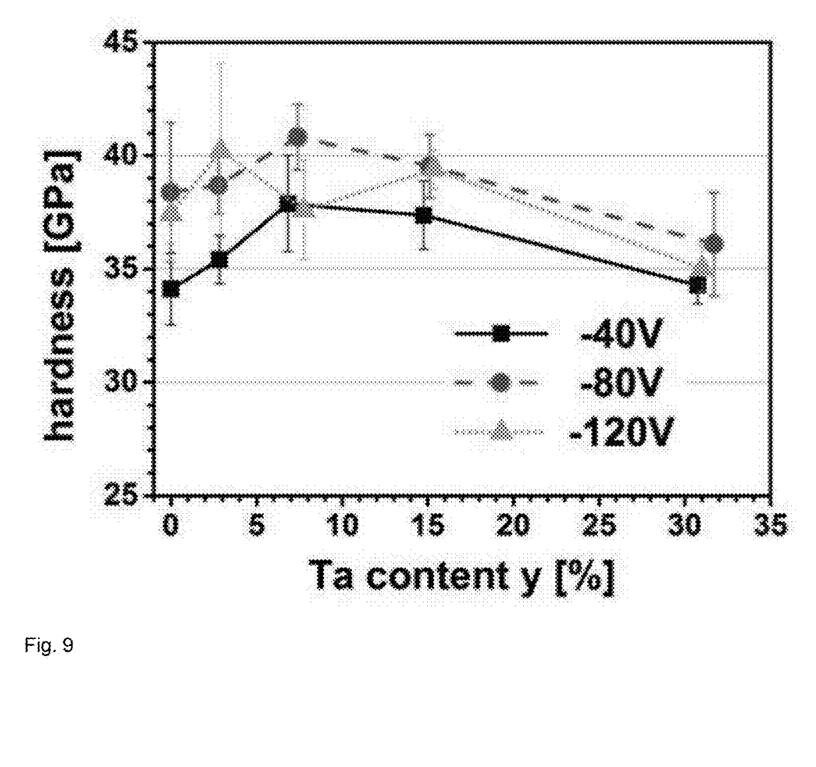
FIG. 9: Hardness of (Al,Cr, Ta)N coatings on S600 high speed steel in dependency of the Ta content y and BIAS voltage.

It can be that the grain boundary bonding is less developed and leads directly to a reduced indentation modulus. The orientation dependent decrease of the Young's modulus is probably for a big part directly reflected in the measured decreasing indentation moduli. As we have observed a slight increase in nitrogen content with increasing BIAS and Ta-content, this might also be a reason for decreasing indentation moduli. The weakening effect due to underdense grain boundaries can also be observed for the hardness of the −40 V BIAS $Cr_{0.34}Al_{0.66}N$ and $Cr_{0.33}Al_{0.64}Ta_{0.03}N$ coatings, see FIG. 9, as the reduced bonding also decreases their measured hardness. Overall, we can see slightly decreasing hardness values with increasing Ta-content. Considering, plasticity indexes like H/E and in combination with the decreasing indentation moduli, strongly increasing ability for plastic deformation at still high hardness can be expected for high Ta-containing coatings like $Cr_{0.30}Al_{0.55}Ta_{0.15}N$ or $Cr_{0.25}Al_{0.44}Ta_{0.31}N$.

Surface SEM images reveal decreasing droplet densities with increasing the BIAS voltage for coatings having chemical composition in atomic ratio of $Cr_{0.34}Al_{0.66}N$. However, additions of Ta are even at −40 V of BIAS significantly more effective and lead to a very smooth surface with a few large droplets on top. The cross sectional micrographs obtained by SEM and TEM exhibit a columnar structure with underdense grain boundaries and an XRD evaluated crystallite size of ~25 nm for Ta-free $Cr_{0.34}Al_{0.66}N$ coatings deposited by using a BIAS of −40 V. With increasing the Ta-content the grain-boundaries densifies, the columnar structure is less pronounced and the crystallite size decreases towards 20 nm. For $Cr_{0.25}Al_{0.44}Ta_{0.31}N$ deposited by using a BIAS of −120 V the crystallite size is reduced to ~5 nm. Considering the preferred orientation of growth of the deposited coatings, it can be seen a clear trend from oriented growth [111] for Ta-free coatings to a [200] dominated growth with increasing Ta-content. The change in preferred orientation has a significant influence on the measured indentation moduli of the coatings according to the present invention which decrease by ~125 GPa with increasing Ta content. However, the hardness stays more or less constant at values >35 GPa and hence a significant increase in plasticity at still high hardness values can be expected. Alloying Ta to high-Al containing single phase cubic (Cr,Al)N according to the present invention allows attaining significantly improved mechanical and structural properties at elevated temperatures.

A hard coating according to the present invention is particularly good for providing excellent abrasion resistance to surfaces of cutting and forming tools which should be exposed to tribological contact (contact tool-workpiece involving relative motion between the tool surface(s) and the workpiece surface(s) in contact) that involves the generation of elevated temperatures at the surface contact point.

Coatings according the present invention having crystallite growth with strong preferred orientation [200] are particularly good for attaining a high protection of tools used by cutting operations are preferred. Because of that the at least one $(Al_aCr_bTa_c)N$ layer should be deposited on a substrate surface in such a manner that depending on the application the preferred orientation at least in the area near to the coating surface be stronger [200].

As it was described above the at least one $(Al_aCr_bTa_c)N$ layer hard layer in a hard coating according to the present invention exhibits a peak intensity ratio $I_{200}/(I_{200}+I_{111}) \geq 0.25$, depending on the application the ratio should be preferably $\geq 0.35$, or more preferably $\geq 0.50$.

According to a preferred embodiment of the present invention the at least one $(Al_aCr_bTa_c)N$ hard layer is deposited on a substrate surface in such a manner that the peak intensity ratio $I_{200}/(I_{200}+I_{111}) \geq 0.25$ presents a variation along the layer thickness.

The peak intensity ratio $I_{200}/(I_{200}+I_{111})$ in the at least one $(Al_aCr_bTa_c)N$ hard layer according to a preferred embodiment of the present invention can be designed in such a manner that it is lower in the area near to the substrate than in the area near to the coating surface.

According to a preferred embodiment of the present invention the at least one $(Al_aCr_bTa_c)N$ layer is deposited on a substrate surface in such a manner that a residual stress variation along the layer thickness is attained.

According to a preferred embodiment of a coating having a $(Al_aCr_bTa_c)N$ layer with variable residual stress, the residual stress should be lower in the area near to the substrate and higher in the area near to the coating surface, depending on the kind of application and/or type of substrate.

According to another preferred embodiment of the present invention the at least one $(Al_aCr_bTa_c)N$ layer is deposited having a polycrystalline structure, preferably a fine crystalline structure. Furthermore, the polycrystalline structure can be deposited in such a manner that in the area near to the substrate the average crystallite size is larger than in the area near to the coating surface. Also, the at least one $(Al_aCr_bTa_c)N$ layers according to the present invention can be deposited having a columnar structure in the area near to the substrate and a polycrystalline structure in the area near to the coating surface.

According to another preferred embodiment of the present invention the at least one $(Al_aCr_bTa_c)N$ layer is deposited having a variable Young's modulus of elasticity. For example the layer can be deposited in order to have a lower Young's Modulus of elasticity in the area near to the substrate than in the area near to the coating surface. For some applications it could be advantageously to maintain the a high hardness ($\geq 35$ GPa) along the complete $(Al_aCr_bTa_c)N$ layer independently of the Young's Modulus variation.

A coating according to the present invention can also comprise more than one $(Al_aCr_bTa_c)N$ layers. For example one $(Al_aCr_bTa_c)N$ lower layer and one $(Al_aCr_bTa_c)N$ upper layer. In this case, the lower layer could be for example be deposited having the characteristics of the above described embodiments corresponding to the area of the at least one $(Al_aCr_bTa_c)N$ layer near to the substrate and the upper layer could be for example be deposited having the characteristics of the above described embodiments corresponding to the area of the at least one $(Al_aCr_bTa_c)N$ layer near to the coating surface.

The present invention provide also a reactive arc ion plating pvd method for depositing hard coatings in a nitrogen reactive atmosphere comprising at least one $(Al_aCr_bTa_c)N$ layer according to the present invention, whereby the peak intensity ratio $I_{200}/(I_{200}+I_{111})$, the residual stress, the kind of polycrystalline structure, the crystallite size, the Young's modulus of elasticity and the hardness of the coating are adjusted arbitrarily according to the required coating properties by selecting BIAS voltage and tantalum content in AlCrTa targets independently of further coating parameters.

What is claimed is:

1. Hard coating on a substrate comprising at least one layer comprising chromium, aluminum tantalum and nitrogen as main components and having a chemical composition of these elements according to the formula:

$$(Al_aCr_bTa_c)N,$$

where the coefficients a, b and c are respectively the concentration of aluminum, chromium and tantalum in atomic ratio considering only Al, Cr and Ta for the calculation of the element composition in the layer, characterized by the at least one layer having the composition $(Al_aCr_bTa_c)N$:

has coefficients a, b and c satisfying following conditions:

$$a = x \cdot (1-c),$$

$$b = (1-x) \cdot (1-c),$$

$$0.60 \leq x \leq 0.70, \text{ and}$$

$$0.01 \leq c \leq 0.5,$$

and exhibits a X-ray diffraction peak intensity ratio $I_{200}/(I_{200}+I_{111}) \geq 0.25$, wherein said peak intensity ratio presents a variation along the layer thickness in such a manner that the peak intensity ratio is lower in an area near the substrate than in an area near the coating surface.

2. Hard coating according to claim 1, characterized by peak intensity ratio $I_{200}/(I_{200}+I_{111}) \geq 0.50$.

3. Hard coating according to claim 1, characterized by the least one layer having element composition $(Al_aCr_bTa_c)N$ layer having a variable residual stress along the layer thickness.

4. Hard coating according to claim 1, characterized in that, the residual stress in the area near to the substrate is lower than in the area near to the coating surface.

5. Hard coating according to claim 1, characterized by the least one layer having element composition $(Al_aCr_bTa_c)N$ layer exhibiting a polycrystalline structure.

6. Hard coating according to claim 1, characterized by the least one layer having element composition $(Al_aCr_bTa_c)N$ layer exhibiting a structure which combines a columnar structure in the area near to the substrate with a fine polycrystalline structure in the area near to the coating surface.

7. Hard coating according to claim 3 characterized in that, the polycrystalline structure exhibits crystallites having different grain sizes, whereby in the area near to the surface coating the average size of the crystallites is smaller than in the area near to the substrate.

8. Hard coating according to claim 1, characterized by the least one layer having element composition $(Al_aCr_bTa_c)N$ layer having a variable Young's modulus of elasticity along the layer thickness.

9. Hard coating according to claim 1, characterized by having a hardness $\geq 32$ GPa along the complete $(Al_aCr_bTa_c)N$ layer.

10. Hard coating according to claim 1, characterized by comprising more than one $(Al_aCr_bTa_c)N$ layer.

11. Reactive arc ion plating pvd method for depositing a hard coating according to claim 1, characterized in that:

depositing the at least one $(Al_aCr_bTa_c)N$ layer from AlCrTA targets in a nitrogen reactive atmosphere, and adjusting coating properties regarding peak intensity ratio I200/(I200+I111), residual stress, kind of polycrystalline structure, crystallite size, Young's modulus of elasticity and coating hardness by selecting deposition temperature, pressure, BIAS voltage and tantalum content in the AlCrTa targets.

* * * * *